United States Patent
Kim et al.

(10) Patent No.: US 8,227,872 B2
(45) Date of Patent: Jul. 24, 2012

(54) HETEROJUNCTION DIODE, METHOD OF MANUFACTURING THE SAME, AND ELECTRONIC DEVICE INCLUDING THE HETEROJUNCTION DIODE

(75) Inventors: Ki-hwan Kim, Anyang-si (KR); Young-bae Kim, Seoul (KR); Seung-ryul Lee, Seoul (KR); Young-soo Park, Yongin-si (KR); Chang-jung Kim, Yongin-si (KR); Bo-soo Kang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 34 days.

(21) Appl. No.: 12/591,917

(22) Filed: Dec. 4, 2009

(65) Prior Publication Data
US 2010/0308297 A1   Dec. 9, 2010

(30) Foreign Application Priority Data
Jun. 3, 2009   (KR) .................. 10-2009-0049093

(51) Int. Cl.
*H01L 29/76*   (2006.01)
*H01L 29/732*  (2006.01)

(52) U.S. Cl. ............... 257/390; 257/2; 257/56; 257/59; 257/76; 257/183; 257/288; 257/E21.078; 257/E21.09; 257/E21.495; 257/E45.003; 365/148; 365/163; 438/104; 438/171; 438/584; 438/585

(58) Field of Classification Search ............... 257/2, 56, 257/59, 76, 183, 288, 390, E21.078, E21.09, 257/E21.495, E45.003; 365/148, 163; 438/104, 438/171, 584, 585
See application file for complete search history.

(56) References Cited

U.S. PATENT DOCUMENTS

| 6,849,564 | B2 | 2/2005 | Hsu et al. |
| 7,001,846 | B2 | 2/2006 | Hsu |
| 7,408,212 | B1 | 8/2008 | Luan et al. |
| 7,812,404 | B2 * | 10/2010 | Herner et al. ............. 257/390 |
| 7,902,537 | B2 * | 3/2011 | Schricker et al. ............. 257/2 |
| 2007/0228414 | A1 * | 10/2007 | Kumar et al. ............. 257/183 |
| 2010/0240167 | A1 * | 9/2010 | Dasgupta et al. ............. 438/63 |

FOREIGN PATENT DOCUMENTS

| JP | 2007-158325 | 6/2007 |
| JP | 2007-165873 | 6/2007 |
| KR | 10-2006-0002905 | 1/2006 |
| KR | 10-0657911 | 12/2006 |

* cited by examiner

*Primary Examiner* — Dao H Nguyen
(74) *Attorney, Agent, or Firm* — Harness, Dickey & Pierce, P.L.C.

(57) ABSTRACT

Example embodiments relate to a heterojunction diode, a method of manufacturing the heterojunction diode, and an electronic device including the heterojunction diode. The heterojunction diode may include a first conductive type non-oxide layer and a second conductive type oxide layer bonded to the non-oxide layer. The non-oxide layer may be a Si layer. The Si layer may be a p++ Si layer or an n++ Si layer. A difference in work functions of the non-oxide layer and the oxide layer may be about 0.8-1.2 eV. Accordingly, when a forward voltage is applied to the heterojunction diode, rectification may occur. The heterojunction diode may be applied to an electronic device, e.g., a memory device.

24 Claims, 7 Drawing Sheets

HETEROJUNCTION DIODE, METHOD OF MANUFACTURING THE SAME, AND ELECTRONIC DEVICE INCLUDING THE HETEROJUNCTION DIODE

CROSS-REFERENCE TO RELATED APPLICATION

This application claims priority under 35 U.S.C. §119 to Korean Patent Application No. 10-2009-0049093, filed on Jun. 3, 2009 with the Korean Intellectual Property Office, the disclosure of which is incorporated herein in its entirety by reference.

BACKGROUND

1. Field

Example embodiments relate to a heterojunction diode, a method of manufacturing the heterojunction diode, and an electronic device including the heterojunction diode.

2. Description of the Related Art

A resistive memory device is a non-volatile memory device that uses resistance variation characteristics of a material (e.g., a transition metal oxide) whose resistance is changed significantly at a particular voltage level. When a voltage higher than a set voltage is applied to the material, the resistance of the material is lowered. This state is referred to as an ON state. If a voltage higher than a reset voltage is applied to the material, the resistance of the material is increased. This state is referred to as an OFF state. A multi-layer cross point resistance memory device has a relatively simple cell structure and is thus effective in achieving a higher degree of integration.

A resistive memory device may include a storage node having a resistance change layer and a switching device that is electrically connected to the storage node. The switching device controls signal access to the storage node. Resistive memory devices of the related art typically use a nickel oxide layer ($NiO_x$) as a resistance change layer, and a transistor or a diode as a switching device. The switching devices used in the resistive memory devices of the related art require a higher temperature process or use relatively expensive noble metal layers (e.g., platinum (Pt) layer) as an electrode, and thus are relatively inefficient in regard to the manufacturing process and/or costs.

SUMMARY

Example embodiments relate to a heterojunction diode in which an oxide layer and a non-oxide layer may be bonded. Example embodiments also relate to a method of manufacturing the heterojunction diode. Example embodiments further relate to an electronic device including the heterojunction diode.

A heterojunction diode according to example embodiments may include a non-oxide layer of a first conductive type and an oxide layer of a second conductive type on the non-oxide layer. The non-oxide layer may be a Si layer that is highly doped with an impurity of the first conductive type. The heterojunction diode may be disposed between two electrodes, and at least one of the two electrodes may include a non-noble metal.

The non-oxide layer of the heterojunction diode may be a p-type layer, and the oxide layer may be an n-type layer. The oxide layer may include at least one of a Zn oxide, an In oxide, an InZn oxide, a GaInZn oxide, a Ti oxide, a Sn oxide, and an InSn oxide. A work function of the non-oxide layer may be greater than a work function of the oxide layer by about 0.8-1.2 eV.

Alternatively, the non-oxide layer may be an n-type layer, and the oxide layer may be a p-type layer. In such a case, the oxide layer may include at least one of a Cu oxide, a Ni oxide, a CuAl oxide, a ZnRh oxide, and a SrCu oxide. A work function of the non-oxide layer may be smaller than a work function of the oxide layer by about 0.8-1.2 eV.

An electronic device according to example embodiments may include the above-described heterojunction diode. The electronic device may be a memory device which includes a data storage element connected to the heterojunction diode.

A resistive memory device according to example embodiments may include a first electrode, a second electrode spaced apart from the first electrode, and a first stack structure between the first and second electrodes. The first stack structure may include a first resistance change layer, a first switching device, and a first intermediate electrode between the first resistance change layer and the first switching device. The first switching device may include a non-oxide layer of a first conductive type and an oxide layer of a second conductive type bonded to each other.

The first intermediate electrode and/or one of the first and second electrodes, which contacts the first switching device, may include a non-noble metal. The non-oxide layer may be a Si layer that is highly doped with an impurity of the first conductive type. The resistive memory device may be a multi-layer cross-point memory device having a 1 D(diode)-1 R(resistor) cell structure.

The non-oxide layer may be a p-type layer, and the oxide layer may be an n-type layer. The oxide layer may include at least one of a Zn oxide, an In oxide, an InZn oxide, a GaInZn oxide, a Ti oxide, a Sn oxide, and an InSn oxide. A work function of the non-oxide layer may be greater than a work function of the oxide layer by about 0.8-1.2 eV.

Alternatively, the non-oxide layer may be an n-type layer, and the oxide layer may be a p-type layer. In such a case, the oxide layer may include at least one of a Cu oxide, a Ni oxide, a CuAl oxide, a ZnRh oxide, and a SrCu oxide. A work function of the non-oxide layer may be smaller than a work function of the oxide layer by about 0.8-1.2 eV.

A plurality of the first electrodes may be arranged as parallel wirings. A plurality of the second electrodes may also be arranged as parallel wirings that cross over the plurality of first electrodes. The first stack structure may be disposed at every cross point between the first and second electrodes.

The resistive memory device may further include a third electrode disposed above and spaced apart from the second electrode; and a second stack structure between the second and third electrodes. The second stack structure may include a second resistance change layer, a second switching device, and a second intermediate electrode between the second resistance change layer and the second switching device.

The second switching device may have the same stack structure as the first switching device or a reversed order structure of the first switching device. The second intermediate electrode and/or one of the second and third electrodes, which contacts the second switching device, may include a non-noble metal.

A plurality of the second electrodes may be arranged as parallel wirings. A plurality of the third electrodes may also be arranged as parallel wirings that cross over the plurality of second electrodes. The second stack structure may be disposed at every cross point between the second and third electrodes.

BRIEF DESCRIPTION OF THE DRAWINGS

The above and/or other aspects of example embodiments may become more apparent and readily appreciated when the following description is taken in conjunction with the accompanying drawings of which.

DETAILED DESCRIPTION

Figure 1:
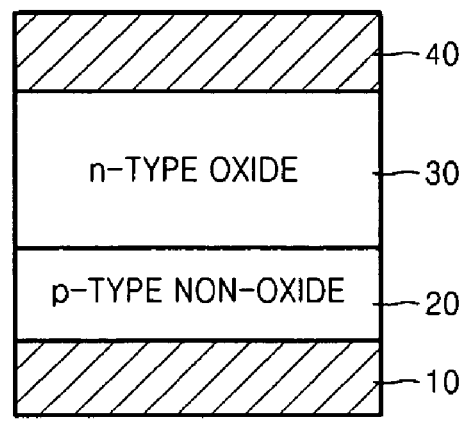
FIG. 1 is a cross-sectional view of a heterojunction diode according to example embodiments.

Various non-limiting, example embodiments will now be described more fully with reference to the accompanying drawings. It should be understood that the specific structural and functional details disclosed herein are merely for illustrative purposes. Thus, example embodiments may be embodied in many alternate forms and should not be construed as limited to the specifics set forth herein. Like numbers refer to like elements throughout the description.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element or layer is referred to as being "formed on" another element or layer, it may be directly or indirectly formed on the other element or layer. For example, intervening elements or layers may be present. In contrast, when an element or layer is referred to as being "directly formed on" another element, there are no intervening elements or layers present. Other words used to describe the relationship between elements or layers should be interpreted in a like fashion (e.g., "between" versus "directly between," "adjacent" versus "directly adjacent," etc.).

The terminology used herein is for the purpose of describing particular instances only and is not intended to limit example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. In the drawings, the thicknesses of layers and regions may have been exaggerated for clarity.

FIG. 1 is a cross-sectional view of a heterojunction diode according to example embodiments. Referring to FIG. 1, the heterojunction diode may include a lower electrode 10, an upper electrode 40, and a p-type non-oxide layer 20 and an n-type oxide layer 30 sequentially disposed between the lower electrode 10 and the upper electrode 40. The p-type non-oxide layer 20 may be, for example, a p-type Si layer. The p-type Si layer may be a p++ Si layer which is highly doped with a p-type impurity, e.g., boron (B), at a density of about $10^{20}$ atom/cm$^3$ or greater. The p-type Si layer may be an amorphous layer or a poly-crystalline layer. The p-type non-oxide layer 20 may have a relatively high work function, for example, about 5.0-5.2 eV, and may also have a relatively low specific resistance.

The n-type oxide layer 30 may include a Zn oxide, an In oxide, an InZn oxide, a GaInZn oxide, a Ti oxide, a Sn oxide, an InSn oxide, or a combination thereof. The InZn oxide, e.g., InZnO$_x$ ($0<x\leqq 2.5$), may become an n-type semiconductor due to Zn interstitials and O vacancies that occur naturally. Similarly, the Zn oxide, the In oxide, the GaInZn oxide, the Ti oxide (TiO$_2$), the Sn oxide (SnO$_2$), and the InSn oxide may also become n-type semiconductors due to O vacancies. For example, the n-type non-oxide layer 30 may have a work function of about 3.5-4.2 eV. Accordingly, the work function of the p-type non-oxide layer 20 may be greater than that of the n-type oxide layer 30 by about 0.8-1.2 eV.

When the p-type non-oxide layer 20 having the greater work function and the n-type oxide layer 30 having the smaller work function are bonded, a sufficiently thick depletion region is formed at a junction thereof and, thus, rectification may occur. If the p-type non-oxide layer 20 has a relatively high electric conductivity similar to that of a metal, the heterojunction diode in which the p-type non-oxide layer 20 and the n-type oxide layer 30 are bonded may show similar rectification characteristics to a Schottky junction diode in which a metal and a semiconductor are bonded.

At least one of the group consisting of the lower electrode 10 and the upper electrode 40 may include a non-noble metal. For example, at least one of the group consisting of the lower electrode 10 and the upper electrode 40 may include Mo, Ni, Ti, Al, Cu, W, or a combination thereof, and may have a single layer structure or a multi-layer structure. The material and structure of the lower electrode 10 and the upper electrode 40 may be the same or different.

Figure 2:
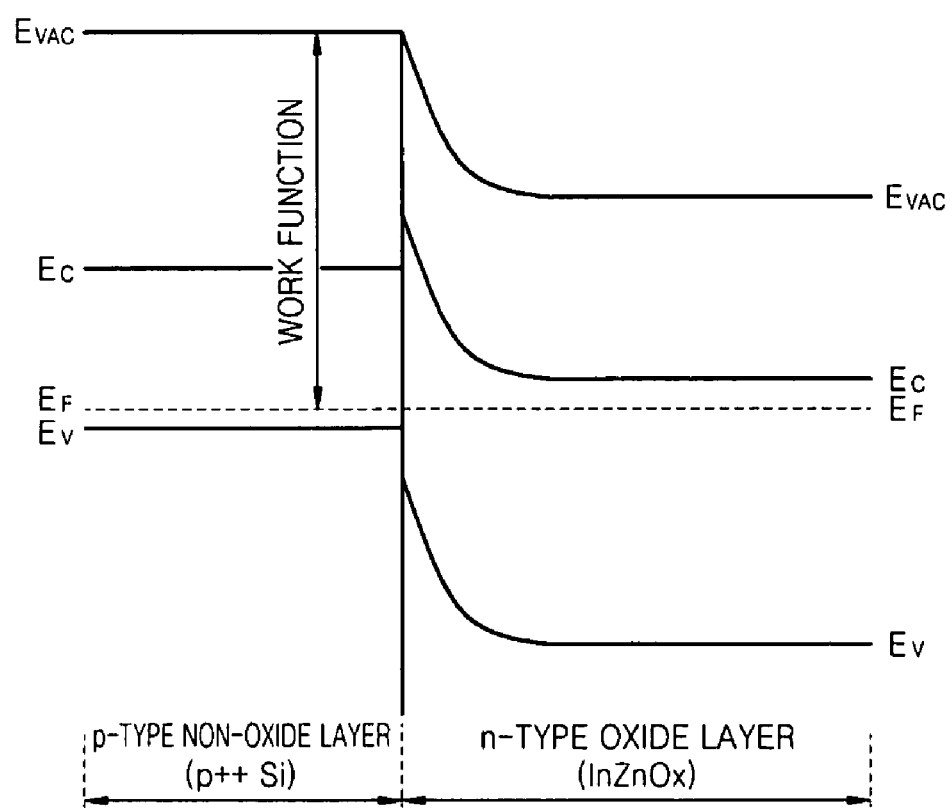
FIG. 2 is an energy band diagram of the heterojunction diode of FIG. 1.

FIG. 2 is an energy band diagram of the p-type non-oxide layer 20 and the n-type oxide layer 30 of the heterojunction diode of FIG. 1. The p-type non-oxide layer 20 may be a p++ Si layer, and the n-type oxide layer 30 may be an InZn oxide layer. A work function of the p++ Si layer is about 5.1 eV, and a work function of the InZn oxide layer is about 4.0 eV. In FIG. 2, reference symbols $E_{VAC}$, $E_C$, and $E_V$ denote a vacuum energy level, a lowermost energy level of a conduction band, and an uppermost energy level of a valence band, respectively. Also, $E_F$ denotes a Fermi energy level. The reference symbols are also used with reference to FIGS. 3 and 5.

Referring to FIG. 2, as the p-type non-oxide layer 20 having a greater work function and the n-type oxide layer 30 having a smaller work function are bonded, a depletion region is formed at a junction thereof. Accordingly, a structure in which the p-type non-oxide layer 20 and the n-type oxide layer 30 are bonded may function as a diode.

Figure 3:
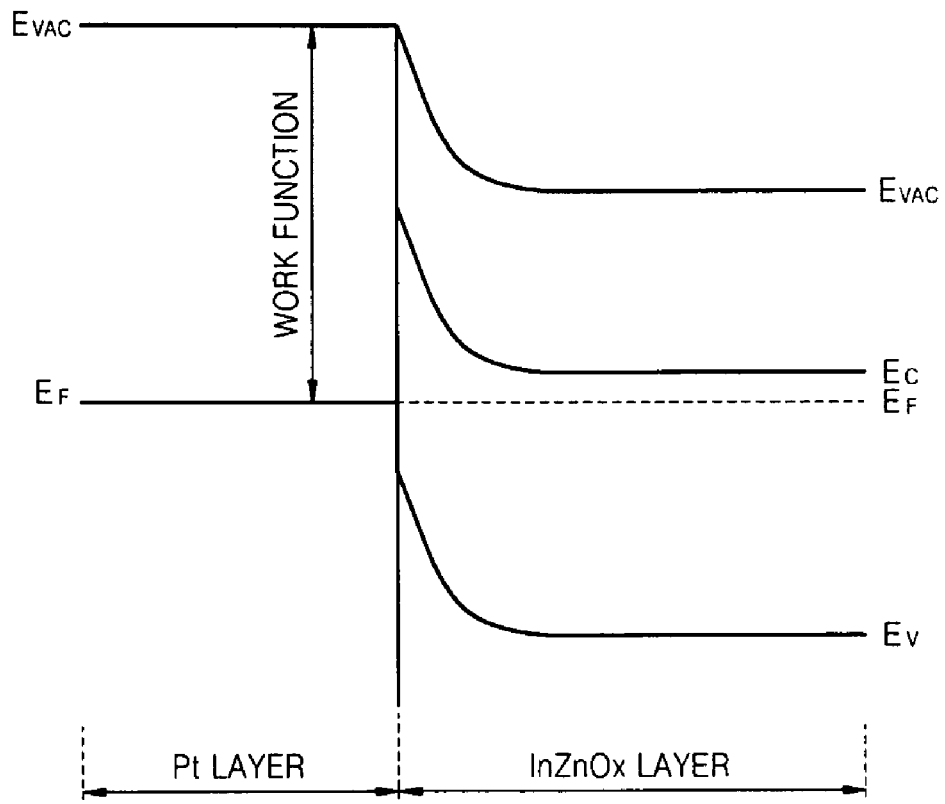
FIG. 3 is an energy band diagram of a diode according to a comparative example.

FIG. 3 is an energy band diagram of a diode according to a comparative example. In particular, FIG. 3 is an energy band diagram of a Schottky junction diode in which a Pt layer and an InZn oxide layer are bonded. Although not illustrated in FIG. 3, a p-type oxide layer (e.g., Cu oxide layer) may be further disposed between the Pt layer and the InZn oxide layer. The Cu oxide layer may function as a buffer layer to provide thermal stability for the Schottky junction diode. If the Cu oxide layer is used, it may be regarded that a pn oxide diode is formed of the Cu oxide layer and the InZn oxide layer. However, even when the Cu oxide layer is used, the Pt layer needs to be used to obtain the desired diode characteristics.

Referring to FIG. 3, a Schottky junction is formed between the InZn oxide layer, which is an n-type semiconductor layer, and a Pt layer, which is a metal layer having a relatively large work function. The energy band diagram of FIG. 3 is similar to that of FIG. 2. According to the comparative example of FIG. 3, diode characteristics may be obtained only when using a relatively expensive electrode material having a relatively large work function, e.g., Pt. If a non-noble metal electrode is used instead of the Pt layer, it may be difficult to obtain rectifying characteristics of required standards for a memory device. As such, according to the diode of the comparative example, because a relatively expensive noble metal is used, the manufacturing costs are higher. However, in example embodiments, because the p-type non-oxide layer 20 having a relatively large work function (e.g., p++ Si layer) is used, the desired rectifying characteristics may be obtained without using a noble metal layer (e.g., Pt layer).

Figure 4:
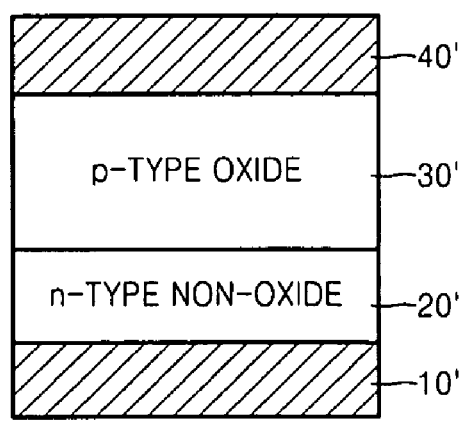
FIG. 4 is a cross-sectional view of another heterojunction diode according to example embodiments.

FIG. 4 is a cross-sectional view of another heterojunction diode according to example embodiments. Referring to FIG. 4, an n-type non-oxide layer 20' and a p-type oxide layer 30' may be sequentially formed between a lower electrode 10' and an upper electrode 40'. The n-type non-oxide layer 20' may be, for example, an n-type Si layer. The n-type Si layer may be an n++ Si layer that is highly doped with an n-type impurity, e.g., phosphorus (P), at a density of about $10^{20}$ atom/cm$^3$ or greater. The n-type Si layer may be an amorphous layer or a poly-crystalline layer. The n-type non-oxide layer 20' may have a relatively low work function, for example, 4.05-4.2 eV and may also have a relatively low specific resistance.

The p-type oxide layer 30' may include, for example, a Cu oxide, a Ni oxide, a CuAl oxide, a ZnRh oxide, a SrCu oxide, or a combination thereof. The Cu oxide may be $CuO_x$ ($x \geq 1$), and the $CuO_x$ ($x \geq 1$) may become a p-type semiconductor, as $O^{2-}$ that could not bond to Cu acts as a donor due to a naturally generated Cu deficiency. Also, $Cu_2O$, which is another example of the Cu oxide, may be a p-type semiconductor. Similarly, a Ni oxide (NiO), a CuAl oxide ($CuAlO_2$), a ZnRh oxide ($ZnRh_2O_4$), a SrCu oxide ($SrCu_2O_2$), etc. may become a p-type semiconductor due to $O^{2-}$ that acts as a donor. The p-type oxide layer 30' may have a relatively large work function, for example, about 4.85-5.4 eV. Accordingly, a work function of the n-type non-oxide layer 20' may be smaller than the work function of the p-type oxide layer 30' by about 0.8-1.2 eV. When the n-type non-oxide layer 20' having a smaller work function and the p-type oxide layer 30' having a greater work function than that of the n-type non-oxide layer 20' are bonded, a sufficiently large depletion region is formed at a junction therebetween, and thus rectification may occur. At least one of the lower electrode 10' and the upper electrode 40' may be formed of a relatively low price non-noble metal electrode, similar to the lower electrode 10 and the upper electrode 40 of FIG. 1.

Figure 5:
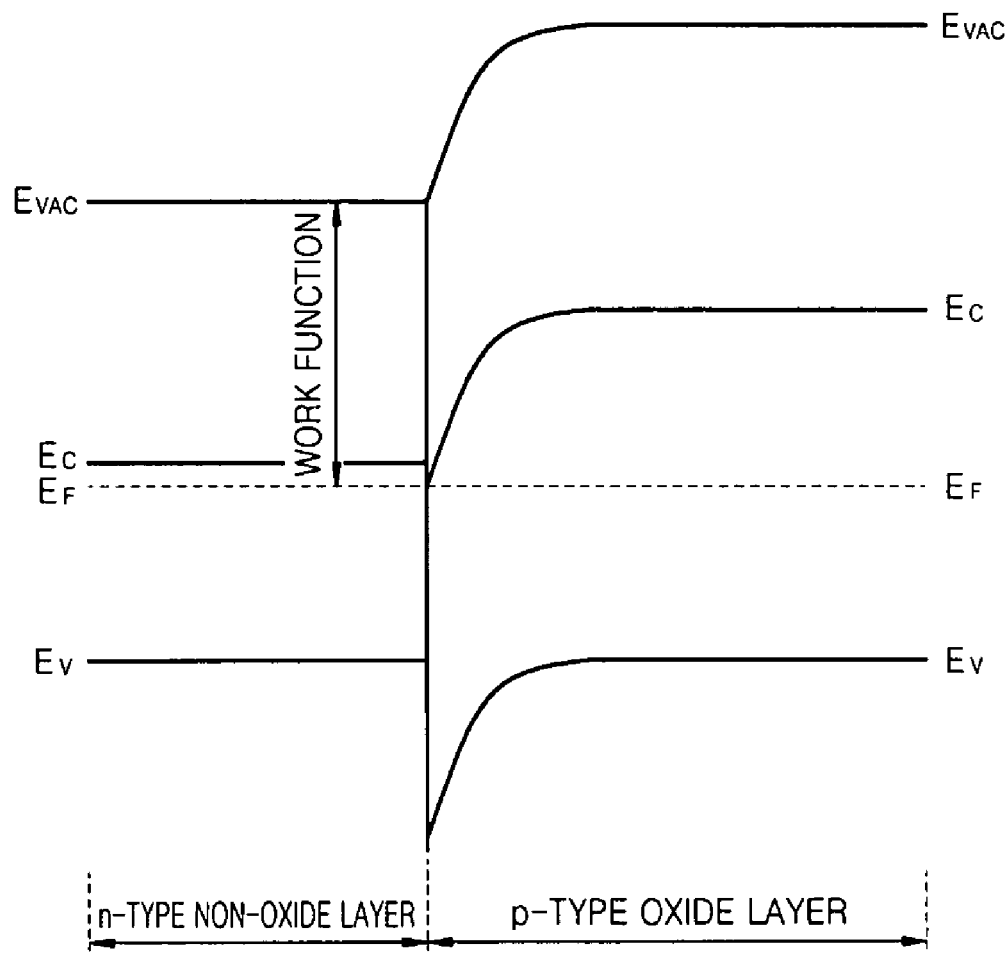
FIG. 5 is an energy band diagram of the heterojunction diode of FIG. 4.

FIG. 5 is an energy band diagram of the n-type non-oxide layer 20' and the p-type oxide layer 30' of FIG. 4. Referring to FIG. 5, as the n-type non-oxide layer 20' having a smaller work function and the p-type oxide layer 30' having a greater work function than that of the n-type non-oxide layer 20' are bonded, a sufficiently large depletion region is formed at a junction therebetween. Accordingly, the structure in which the n-type non-oxide layer 20' and the p-type oxide layer 30' are bonded may exhibit the desired diode characteristics.

FIGS. 6A through 6D are cross-sectional views of a method of manufacturing a heterojunction diode according to example embodiments. The method may be used to manufacture the heterojunction diode of FIG. 1.

Figure 6A:
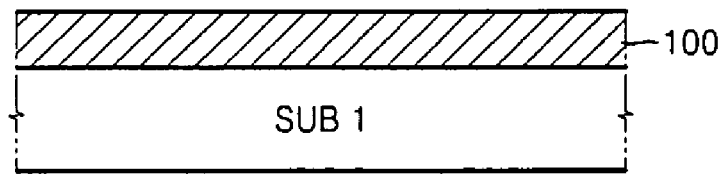
FIGS. 6A through 6D are cross-sectional views of a method of manufacturing a heterojunction diode according to example embodiments.

Referring to FIG. 6A, a lower electrode 100 may be formed on a substrate SUB1. The substrate SUB1 may be one selected from the group consisting of a glass substrate, a semiconductor substrate (e.g., silicon substrate), a hard plastic substrate, and a flexible plastic substrate. The lower electrode 100 may be formed of a non-noble metal, e.g., Mo, Ni, Ti, Al, Cu, or W. For example, the lower electrode 100 may be formed by using a physical vapor deposition (PVD) method, e.g., sputtering method. The sputtering method may be a direct current (DC) magnetron sputtering method, but example embodiments are not limited thereto. The lower electrode 100 formed on the entire upper surface of the substrate SUB1 may be patterned in a given shape. The lower electrode 100 is usually patterned at this stage, but the patterning may also be performed at a later time.

Figure 6B:
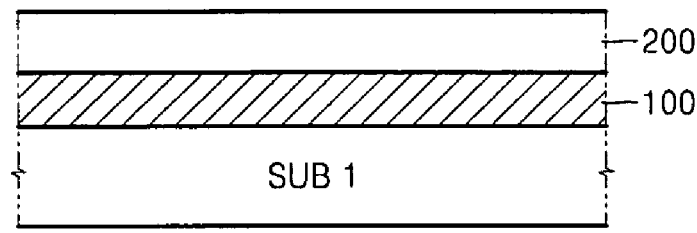

Referring to FIG. 6B, a p-type non-oxide layer 200 may be formed on the lower electrode 100. The p-type non-oxide layer 200 may be formed of the same material as the p-type non-oxide layer 20 of FIG. 1. For example, the p-type non-oxide layer 200 may be a p++ Si layer. In this case, the p-type non-oxide layer 200 may be formed using a plasma-enhanced chemical vapor deposition (PECVD) method. A doping material used here may be, for example, boron (B), and a source gas of B may be $B_2H_5$. A source gas of Si may be, for example, $SiH_4$. A deposition temperature may be about 350° C. The doping density of B may be about $10^{20}$ atom/cm$^3$ or greater, for example, about $10^{21}$ atom/cm$^3$. A thickness of the p-type non-oxide layer 200 may be several tens to several hundreds nm. The material, formation method, or process conditions of the p-type non-oxide layer 200 are not limited to those described above and may vary. For example, an impurity ion, e.g., B, may be doped using an ion implantation method.

Figure 6C:
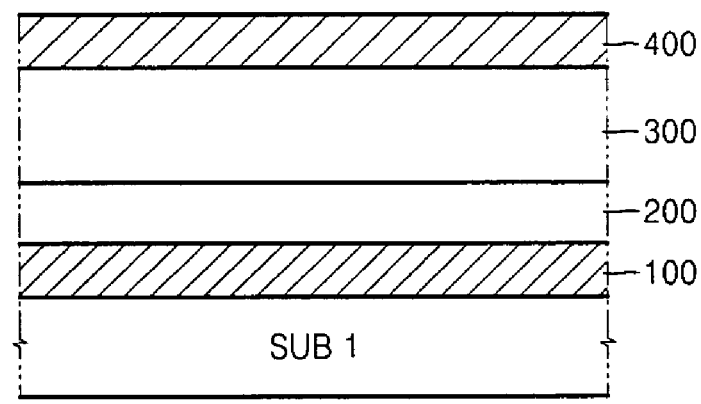

Referring to FIG. 6C, an n-type oxide layer 300 may be formed on the p-type non-oxide layer 200. The n-type oxide layer 300 may be formed of the same material as the n-type oxide layer 30 of FIG. 1. For example, the n-type oxide layer 300 may be formed of an InZn oxide. In this case, the n-type oxide layer 300 may be formed by using a radio frequency (RF) magnetron sputtering method performed at a relatively low temperature, and a thickness of the n-type oxide layer 300 may be several tens to several hundreds of nm. It should be understood that the material, formation method, and process conditions of the n-type oxide layer 300 described herein are non-limiting examples thereof. An upper electrode 400 may be formed on the n-type oxide layer 300. Similar to the lower electrode 300, the upper electrode 400 may be formed of a non-noble metal.

Figure 6D:
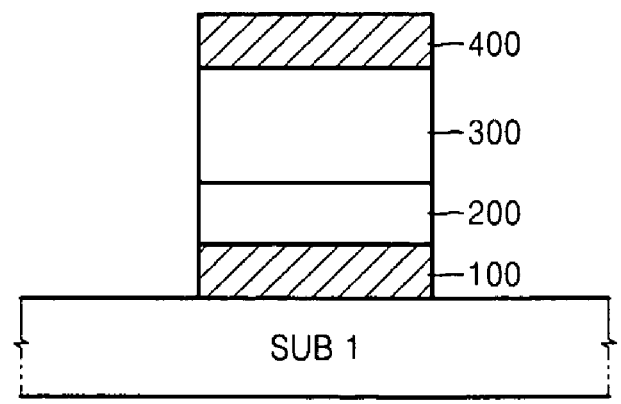

Referring to FIG. 6D, the upper electrode 400, the n-type oxide layer 300, the p-type non-oxide layer 200, and the lower electrode 100 may be patterned. However, the lower electrode 200 need not be patterned at this stage. For instance, the n-type oxide layer 300 and the p-type non-oxide layer 200 may be patterned before forming the upper electrode 400. The lower electrode 100 may also be patterned before forming the upper electrode 400.

Before or after patterning the n-type oxide layer 300 and the p-type non-oxide layer 200, an annealing process for the p-type non-oxide layer 200 may be performed. A temperature of the annealing process may be about 300-350° C., or may be higher according to circumstances. An annealing time may be several tens of minutes to several hours. For example, the annealing time may be about 1 hour. The annealing process may also be performed before forming the n-type oxide layer 300.

As described above, a heterojunction diode may be formed using a relatively low temperature process at about 350° C. or lower. Accordingly, the heterojunction diode may be formed on various types of substrates, and may be applied to a stack memory device with relative ease. Also, problems, which might occur if a higher temperature process is used, may be avoided.

The method of manufacturing the heterojunction diode of FIG. 1 has been described above with reference to FIGS. 6A through 6D. However, it should be understood that the heterojunction diode of FIG. 4 may also be manufactured in a similar manner.

Figure 7:
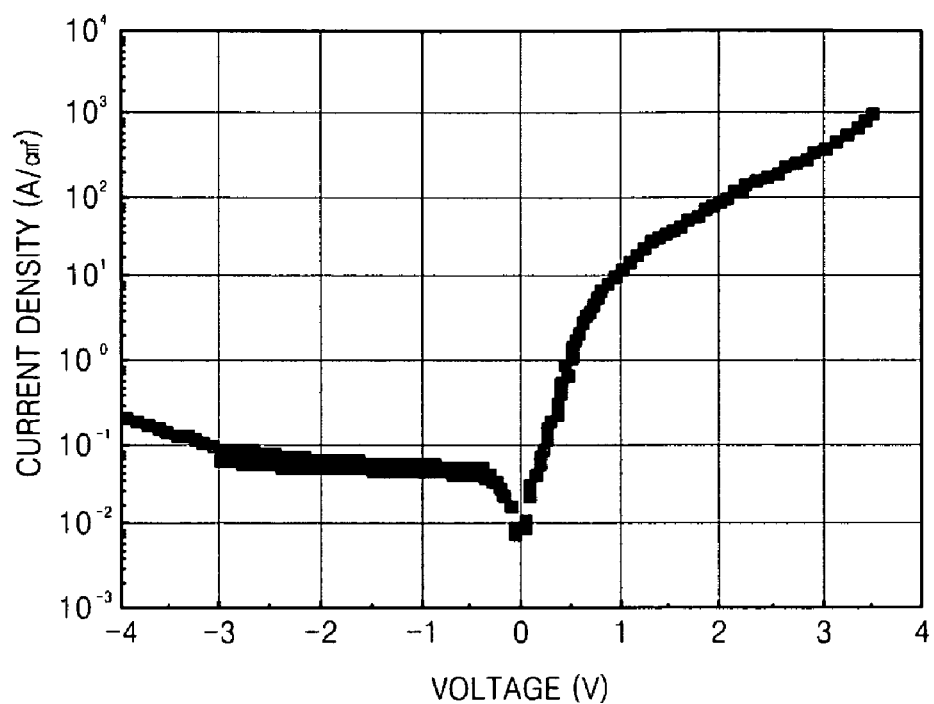
FIGS. 7 and 8 are graphs showing voltage-current characteristics of a heterojunction diode according to example embodiments.

FIG. 7 is a graph showing voltage-current characteristics of a heterojunction diode manufactured according to example embodiments. The results of FIG. 7 were obtained from a heterojunction diode having the structure of FIG. 6D, wherein a Mo layer, a p++ Si layer, an $InZnO_x$ layer, and a Mo layer were used as the lower electrode 100, the p-type non-oxide layer 200, the n-type oxide layer 300, and the upper electrode 400, respectively. In this example, the p++ Si layer was annealed at about 300° C. for 1 hour. The annealing was performed after patterning the lower electrode 100, the p-type non-oxide layer 200, the n-type oxide layer 300, and the upper electrode 400. Referring to FIG. 7, the desired rectifying characteristics with a forward current density of $10^3$ A/cm$^3$ or greater and a forward/backward current ratio of about 104 were obtained.

Figure 8:
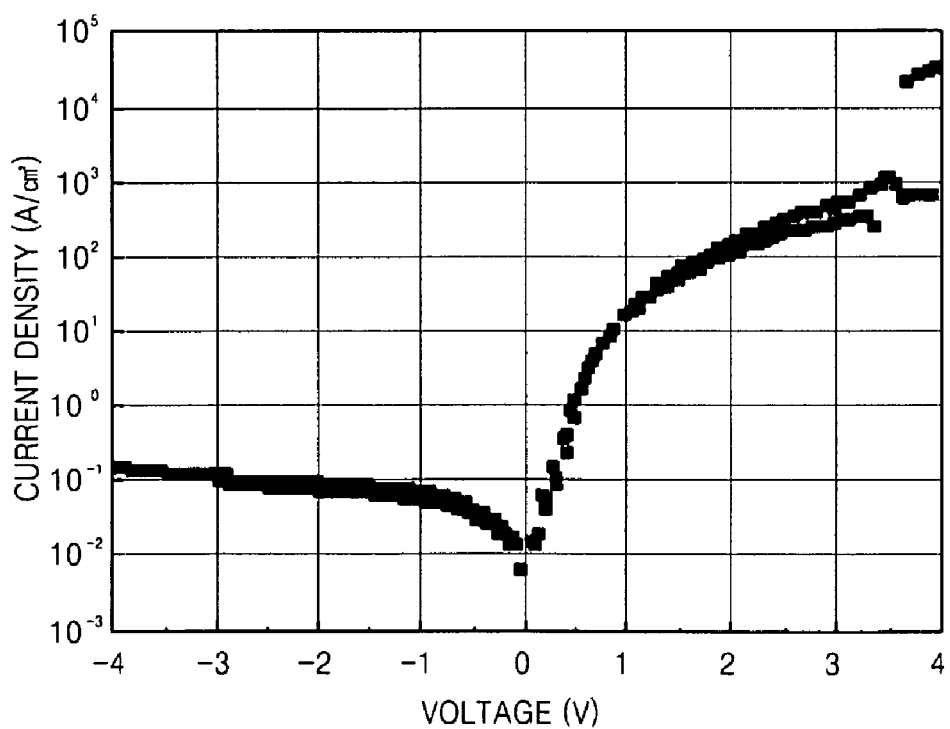

FIG. 8 is a graph showing voltage-current characteristics of another heterojunction diode manufactured according to example embodiments. The results of FIG. 8 were obtained from a heterojunction diode which is different from the diode corresponding to FIG. 7 in terms of when an annealing process is performed and the annealing process conditions. When the diode corresponding to FIG. 8 was manufactured, annealing was performed with respect to a p-type non-oxide layer (p++ Si layer) before forming an n-type oxide layer ($InZnO_x$ layer). The annealing temperature was about 350° C., and the annealing time was about 1 hour. Other conditions were the same as the heterojunction diode of FIG. 7. The graph of FIG. 8 is similar to that of FIG. 7. Accordingly, as may be seen from the graph, variations in the point of time when the annealing was performed or the annealing conditions with respect to the p-type non-oxide layer, which is a p++ Si layer, do not significantly affect rectifying characteristics of a diode.

The heterojunction diode according to example embodiments may be used in various electronic devices for various purposes. For example, the heterojunction diode may be used as a switching device of a memory device. The memory device may include a data storage element and a switching device connected to the data storage element. The data storage element may include a material layer capable of storing bit data, e.g., a resistance change layer, a ferroelectric layer, a ferromagnetic layer, a phase change layer, etc. The switching device may control access of a signal to the data storage element. The heterojunction diode according to example embodiments may be used as the switching device.

Figure 9:
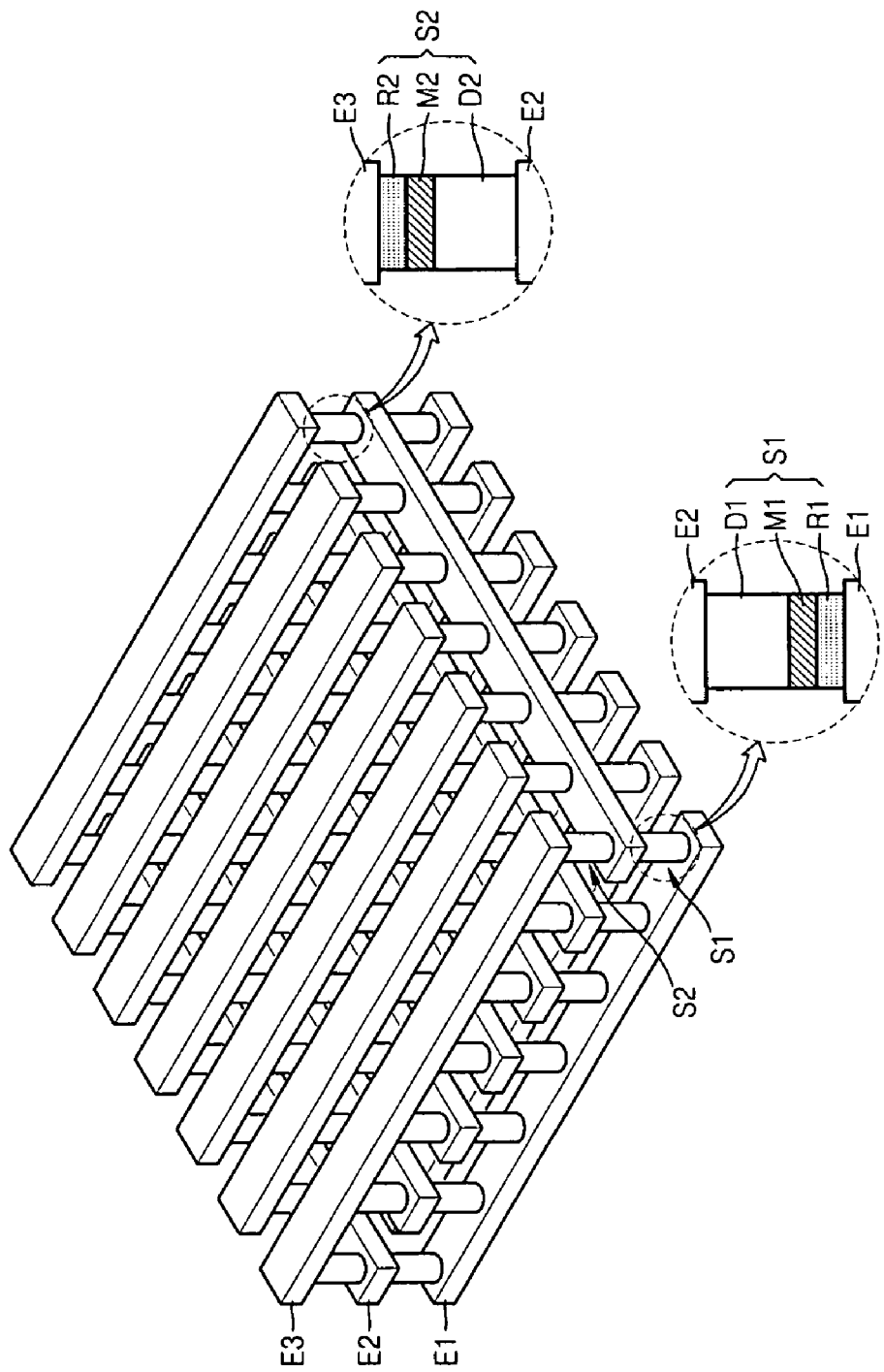
FIG. 9 is a perspective view of a memory device including a heterojunction diode according to example embodiments.

FIG. 9 illustrates a memory device including a heterojunction diode according to example embodiments. The memory device illustrated in FIG. 9 is a multi-layer cross-point resistive memory device having a 1 D(diode)-1 R(resistor) cell structure. Referring to FIG. 9, the resistive memory device may include a plurality of first wirings E1 arranged parallel to one another in a first direction and a plurality of second wirings E2 arranged across the first wirings E1, and a plurality of first stack structures S1 respectively formed between where the first wirings El and the second wirings E2 cross each other. The first stack structure S1 may include a first resistance change layer R1, a first intermediate electrode M1, and a first diode D1 sequentially stacked on the first wirings E1. The positions of the first resistance change layer R1 and the first diode D1 may be switched. The first diode D1 may have the structure of the heterojunction diode of FIG. 1, e.g., the structure in which the p-type non-oxide layer 20 and the n-type oxide layer 30 are bonded, or a reversed order structure thereof.

Alternatively, the first diode D1 may have the structure of the heterojunction diode of FIG. 4, e.g., a structure in which the n-type non-oxide layer 20' and the p-type oxide layer 30' are bonded, or a reversed order structure thereof. The first intermediate electrode M1 and the second wiring E2 may respectively correspond to the lower electrode 10 or 10' and the upper electrode 40 or 40' of FIG. 1 or 4. Accordingly, at least one of the first intermediate electrode M1 and the second wirings E2 may include a non-noble metal, e.g., Mo, Ni, Ti, Al, Cu, W, etc.

A plurality of third wirings E3 may be further disposed a predetermined distance from upper surfaces of the second wirings E2. The third wirings E3 may be arranged at equal distances across the second wirings E2. A plurality of second stack structures S2 may be respectively disposed between where the second wirings E2 and the third wirings E3 cross each other.

The second stack structures S2 may include a second diode D2, a second intermediate electrode M2, and a second resistance change layer R2 that are sequentially stacked on the second wirings E2. The positions of second diode D2 and the second resistance change layer R2 may be switched. The second diode D2 may be a heterojunction diode having a reversed order structure of the first diode D1 or the same stack structure as the first diode D1. The second wirings E2 and the second intermediate electrodes M2 may respectively correspond to the lower electrode 10 or 10' and the upper electrode 40 or 40' of FIG. 1 or 4. Accordingly, at least one of the second wirings E2 and the second intermediate electrodes M2 may include a non-noble metal, e.g., Mo, Ni, Ti, Al, Cu, W, etc.

Figure 10:
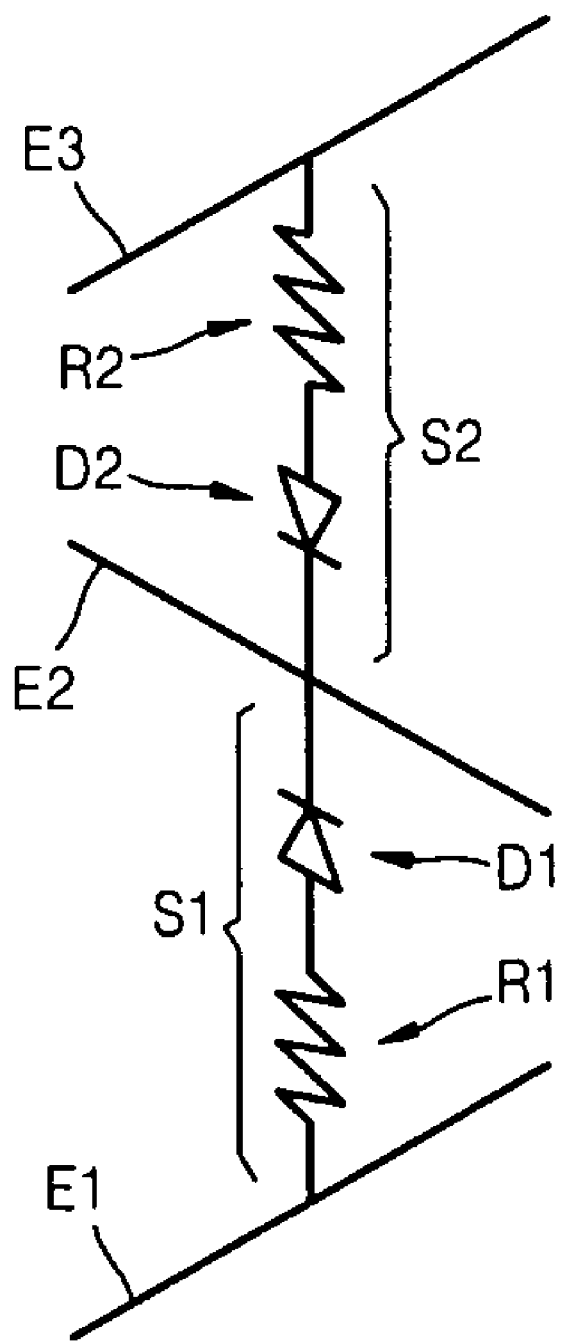
FIG. 10 is a circuit diagram of a memory device according to example embodiments.

FIG. 10 is a circuit diagram of the first wiring El, the first stack structure Si, the second wiring E2, the second stack structure S2, and the third wiring E3 of the resistive memory device of FIG. 9. Referring to FIG. 10, rectification directions of the first and second diodes D1 and D2 may be opposite to each other. For example, the first diode D1 may include an n-type oxide layer on a p-type non-oxide, and the second diode D2 may include a p-type non-oxide layer on an n-type oxide layer. Alternatively, the first diode D1 may include an n-type non-oxide layer on a p-type oxide layer, and the second diode D2 may include a p-type oxide layer on the n-type non-oxide layer. The p-type non-oxide layer, the n-type oxide layer, the p-type oxide layer, and the n-type non-oxide layer may be formed of the same materials described with reference to FIGS. 1 and 4.

Referring to FIG. 10, the first and second stack structures S1 and S2 may be vertically symmetrical with respect to the second wiring E2. The rectification directions of the first and second diodes D1 and D2 are opposite to each other. Thus, data may be written to the first and second resistance change layers R1 and R2 simultaneously by using the second wiring E2 as a common bit line. However, data may also be recorded to the first or second resistance change layer R1 or R2 by one operation. For instance, the first and second resistance change layers R1 and R2 may be programmed at the same time or individually.

In FIG. 10, the rectification directions of the first and second diodes D1 and D2 are opposite to each other, but example embodiments are not limited thereto. For instance, the rectification directions of the first and second diodes D1 and D2 may be the same. Also, the positions of the first resistance change layer R1 and the first diode D1 may be switched, and the positions of the second resistance change layers R2 and the second diode D2 may also be switched.

Although not shown in FIG. 9, the resistive memory device according to example embodiments may further include a structure which has the same structure as a stacked structure including the first stack structures S1 and the second wirings E2, on the third wiring E3. Alternatively, the resistive memory device may further include at least one or more sets of structures, each of which having the same structure as a stacked structure including the first stack structure S1, the second wiring E2, the second stack structure S2 and the third wiring E3, on the third wiring E3.

The resistive memory device may further include at least one or more sets of structures, each of which having the same stack structure as a stacked structure in which the first stack structure S1, the second wiring E2, the second stack structure S2, the third wiring E3, the first stack structure S1, and the second wiring E2 are sequentially stacked, on the third wiring E3.

In FIG. 9, although the first and second stack structures S1 and S2 are illustrated as being cylindrically-shaped, it should be understood that they may have other suitable shapes, e.g., square pillars or pillars that increase in width in the downward direction. For example, the first and second stack structures S1 and S2 may have asymmetric shapes, which extend beyond the crossing points between the first and second wires E1 and E2 and the second and third wires E2 and E3. Also, the structure of the resistive memory device of FIG. 9 may be modified in various other ways.

In addition, the resistance change layers R1 and R2 of FIG. 9 may be formed of a material having variable resistance characteristics, for example, a transition metal oxide (TMO). In detail, the resistance change layers R1 and R2 may be formed of at least one material selected from the group consisting of a Ni oxide, a Cu oxide, a Ti oxide, a Co oxide, a Hf oxide, a Zr oxide, a Zn oxide, a W oxide, a Nb oxide, a TiNi oxide, a LiNi oxide, an Al oxide, an InZn oxide, a V oxide, a SrZr oxide, a SrTi oxide, a Cr oxide, a Fe oxide, a Ta oxide, and a combination thereof. The materials having the variable resistance characteristics may reversibly change from a higher resistance state to a lower resistance state or vice versa. Accordingly, the resistive memory device may be a rewritable memory, but example embodiments are not limited thereto. If the resistance change layers R1 and R2 include an element which irreversibly changes from a higher resistance state to a lower resistance state, since a memory cell that is programmed once may not return to its original state, the resistive memory device may be a one-time programmable (OTP) memory. An example of an irreversibly changing element is an antifuse. The antifuse may be formed of a dielectric material, for example, a silicon oxide or a silicon nitride.

While example embodiments have been particularly shown and described with reference to the accompanying drawings, the examples should be considered in a illustrative sense only and not for purposes of limitation. For example, it will be understood by those of ordinary skill in the art that the heterojunction diode according to example embodiments may be applied not only to memory devices but also to various other electronic devices. Also, the structure of the heterojunction diode and the method of manufacturing the same may be modified in various ways. For example, the form of the lower electrodes 10 and 10' and the upper electrodes 40 and 40' may be modified in various ways, the positions of the p-type non-oxide layer 20 and the n-type oxide layer 30 may be exchanged, and the position of the n-type non-oxide layer 20' and the p-type oxide layer 30' may also be exchanged. Therefore, the scope of example embodiments is defined not by the detailed description but by the appended claims.

Thus, while example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A heterojunction diode comprising:
   a non-oxide layer of a first conductive type; and
   an oxide layer of a second conductive type on the non-oxide layer,
   wherein a difference in work functions at a junction interface of the non-oxide layer and the oxide layer is about 0.8-1.2 eV, and the non-oxide layer is doped to a density of about $10^{20}$ atom/cm$^3$ or greater.

2. The heterojunction diode of claim 1, wherein the non-oxide layer is a Si layer that is doped with an impurity of the first conductive type.

3. The heterojunction diode of claim 1, wherein the non-oxide layer is a p-type layer, and the oxide layer is an n-type layer.

4. The heterojunction diode of claim 3, wherein the oxide layer includes at least one of a Zn oxide, an In oxide, an InZn oxide, a GaInZn oxide, a Ti oxide, an Sn oxide, and an InSn oxide.

5. The heterojunction diode of claim 3, wherein a work function of the non-oxide layer is greater than a work function of the oxide layer by about 0.8-1.2 eV.

6. The heterojunction diode of claim 1, wherein the non-oxide layer is an n-type layer, and the oxide layer is a p-type layer.

7. The heterojunction diode of claim 6, wherein the oxide layer includes at least one of a Cu oxide, a Ni oxide, a CuAl oxide, a ZnRh oxide, and a SrCu oxide.

8. The heterojunction diode of claim 6, wherein a work function of the non-oxide layer is smaller than a work function of the oxide layer by about 0.8-1.2 eV.

9. The heterojunction diode of claim 1, further comprising:
   two electrodes,
   wherein the non-oxide layer and oxide layer are between the two electrodes, and at least one of the two electrodes includes a non-noble metal.

10. An electronic device comprising the heterojunction diode of claim 1.

11. The electronic device of claim 10, further comprising:
    a data storage element connected to the heterojunction diode,
    wherein the electronic device is a memory device.

12. A resistive memory device comprising:
a first electrode;
a second electrode spaced apart from the first electrode; and
a first stack structure between the first and second electrodes, the first stack structure including a first resistance change layer, a first switching device, and a first intermediate electrode between the first resistance change layer and the first switching device,
wherein the first switching device includes a non-oxide layer of a first conductive type and an oxide layer of a second conductive type bonded to each other, a difference in work functions at a junction interface of the non-oxide layer and the oxide layer is about 0.8-1.2 eV, and the non-oxide layer is doped to a density of about $10^{20}$ atom/cm$^3$ or greater.

13. The resistive memory device of claim 12, wherein the non-oxide layer is a Si layer that is doped with an impurity of the first conductive type.

14. The resistive memory device of claim 12, wherein the non-oxide layer is a p-type layer, and the oxide layer is an n-type layer.

15. The resistive memory device of claim 14, wherein the oxide layer includes at least one of a Zn oxide, an In oxide, an InZn oxide, a GaInZn oxide, a Ti oxide, an Sn oxide, and an InSn oxide.

16. The resistive memory device of claim 12, wherein the non-oxide layer is an n-type layer, and the oxide layer is a p-type layer.

17. The resistive memory device of claim 16, wherein the oxide layer includes at least one of a Cu oxide, a Ni oxide, a CuAl oxide, a ZnRh oxide, and a SrCu oxide.

18. The resistive memory device of claim 12, wherein at least one of the first electrode, the first intermediate electrode, and the second electrode contacts the first switching device and includes a non-noble metal.

19. The resistive memory device of claim 12, further comprising:
a plurality of the first electrodes arranged as parallel wirings; and
a plurality of the second electrodes arranged as parallel wirings and crossing over the plurality of first electrodes,
wherein the first stack structure is disposed at every cross point between the first and second electrodes.

20. The resistive memory device of claim 12, further comprising:
a third electrode above and spaced apart from the second electrode; and
a second stack structure between the second and third electrodes, the second stack structure including a second resistance change layer, a second switching device, and a second intermediate electrode between the second resistance change layer and the second switching device.

21. The resistive memory device of claim 20, wherein the second switching device has the same stack structure as the first switching device or a reversed order structure of the first switching device.

22. The resistive memory device of claim 20, wherein at least one of second electrode, the second intermediate electrode, and the third electrode contacts the second switching device and includes a non-noble metal.

23. The resistive memory device of claim 20, further comprising:
a plurality of the second electrodes arranged as parallel wirings; and
a plurality of the third electrodes arranged as parallel wirings and crossing over the plurality of second electrodes,
wherein the second stack structure is disposed at every cross point between the second and third electrodes.

24. A method of manufacturing a heterojunction diode, comprising:
forming a non-oxide layer of a first conductive type; and
forming an oxide layer of a second conductive type on the first conductive non-oxide layer,
wherein a difference in work functions at a junction interface of the non-oxide layer and the oxide layer is about 0.8-1.2 eV, and the non-oxide layer is doped to a density of about $10^{20}$ atom/cm$^3$ or greater.

* * * * *